(12) United States Patent
May et al.

(10) Patent No.: US 8,130,871 B2
(45) Date of Patent: Mar. 6, 2012

(54) INTEGRATED CIRCUIT HAVING RADIO RECEIVER AND METHODS FOR USE THEREWITH

(75) Inventors: Michael R. May, Austin, TX (US); Erich Lowe, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 1122 days.

(21) Appl. No.: 11/328,830

(22) Filed: Jan. 9, 2006

(65) Prior Publication Data
US 2007/0160167 A1 Jul. 12, 2007

(51) Int. Cl.
| | |
|---|---|
| H04L 27/00 | (2006.01) |
| H03M 1/48 | (2006.01) |
| H03M 3/00 | (2006.01) |
| H03M 1/12 | (2006.01) |

(52) U.S. Cl. ........ 375/316; 375/322; 375/326; 341/117; 341/143; 341/155

(58) Field of Classification Search .......... 375/219, 375/316, 344, 340, 349, 322, 326; 370/100.1; 341/117, 143, 155; 327/291
See application file for complete search history.

(56) References Cited

U.S. PATENT DOCUMENTS

| | | | |
|---|---|---|---|
| 4,494,021 A | 1/1985 | Bell et al. | |
| 4,790,320 A | 12/1988 | Perten et al. | |
| 5,059,924 A | 10/1991 | JenningsCheck | |
| 5,113,189 A | 5/1992 | Messer et al. | |
| 5,157,395 A | 10/1992 | Del Signore et al. | |
| 5,233,542 A | 8/1993 | Hohner et al. | |
| 5,394,116 A | 2/1995 | Kasturia | |
| 5,448,245 A | 9/1995 | Takase | |
| 5,495,203 A * | 2/1996 | Harp et al. | 329/306 |
| 5,500,874 A * | 3/1996 | Terrell | 375/232 |
| 5,504,751 A * | 4/1996 | Ledzius et al. | 341/144 |
| 5,590,065 A | 12/1996 | Lin | |
| 5,745,394 A | 4/1998 | Tani | |
| 5,793,819 A * | 8/1998 | Kawabata | 375/344 |
| 5,889,759 A | 3/1999 | McGibney | |

(Continued)

FOREIGN PATENT DOCUMENTS

WO WO 03/061143 A3 7/2003

(Continued)

OTHER PUBLICATIONS

K. Muhammad et al., A Discrete-Time Bluetooth Receiver in a 0.13 Digital CMOS Process; ISSCC 2004/Session 15/Wireless Consumer ICs/15.1, Texas Instruments, Dallas, Texas, 2004 (pp. 214, 215).

(Continued)

*Primary Examiner* — Khanh C Tran
*Assistant Examiner* — Eboni Hughes
(74) *Attorney, Agent, or Firm* — Toler Law Group (57) ABSTRACT

An integrated circuit includes a radio receiver for receiving a received radio signal having a plurality of channel signals, each of the plurality of channel signals being modulated at one of a corresponding plurality of carrier frequencies. The radio receiver converts a selected one of the plurality of channel signals into a demodulated signal. An interface clock generator generates a first interface clock at a first interface clock frequency that varies based on the selected one of the plurality of channel signals. The first interface clock frequency, and integer multiples of the first clock frequency are not substantially equal to the carrier frequency of the selected one of the plurality of channel signals. A driver module drives a device interface with a device based on the first interface clock.

28 Claims, 11 Drawing Sheets

U.S. PATENT DOCUMENTS

| | | | |
|---|---|---|---|
| 5,937,013 A | 8/1999 | Lam et al. | |
| 5,952,947 A | 9/1999 | Nussbaum et al. | |
| 5,959,563 A | 9/1999 | Ring | |
| 5,987,620 A | 11/1999 | Tran | |
| 6,021,110 A | 2/2000 | McGibney | |
| 6,044,307 A | 3/2000 | Kamiya | |
| 6,125,077 A | 9/2000 | Robinson et al. | |
| 6,229,367 B1 | 5/2001 | Choudhury | |
| 6,256,358 B1 | 7/2001 | Whikehart et al. | |
| 6,356,603 B1 | 3/2002 | Martin et al. | |
| 6,407,606 B1 | 6/2002 | Miura | |
| 6,433,726 B1* | 8/2002 | Fan | 341/155 |
| 6,498,927 B2* | 12/2002 | Kang et al. | 455/245.2 |
| 6,525,585 B1 | 2/2003 | Iida et al. | |
| 6,559,788 B1 | 5/2003 | Murphy | |
| 6,633,187 B1 | 10/2003 | May et al. | |
| 6,683,919 B1 | 1/2004 | Olgaard et al. | |
| 6,728,325 B1 | 4/2004 | Hwang et al. | |
| 6,771,103 B2 | 8/2004 | Watanabe et al. | |
| 6,788,236 B2 | 9/2004 | Erdogan et al. | |
| 6,794,912 B2 | 9/2004 | Hirata et al. | |
| 6,822,692 B2 | 11/2004 | Menkhoff | |
| 6,943,610 B2 | 9/2005 | Saint-Laurent | |
| 6,970,717 B2 | 11/2005 | Behrens et al. | |
| 7,106,809 B2 | 9/2006 | Whikehart et al. | |
| 7,197,524 B2 | 3/2007 | Sasson et al. | |
| 7,391,347 B2 | 6/2008 | May et al. | |
| 2001/0020866 A1* | 9/2001 | Toshinori | 329/304 |
| 2002/0048325 A1 | 4/2002 | Takahiko | |
| 2002/0064245 A1 | 5/2002 | McCorkle | |
| 2002/0111785 A1 | 8/2002 | Swoboda | |
| 2002/0126771 A1 | 9/2002 | Li et al. | |
| 2002/0141523 A1* | 10/2002 | Litwin et al. | 375/356 |
| 2002/0150173 A1* | 10/2002 | Buda | 375/316 |
| 2004/0021595 A1 | 2/2004 | Erdogan et al. | |
| 2004/0107407 A1 | 6/2004 | Henson et al. | |
| 2004/0114406 A1 | 6/2004 | May | |
| 2005/0047495 A1* | 3/2005 | Yoshioka | 375/219 |
| 2005/0117071 A1 | 6/2005 | Johnson | |
| 2005/0117664 A1* | 6/2005 | Adan et al. | 375/316 |
| 2005/0141411 A1 | 6/2005 | Friedrich et al. | |
| 2005/0170806 A1 | 8/2005 | Kim | |
| 2005/0265486 A1* | 12/2005 | Crawley | 375/326 |
| 2006/0116073 A1 | 6/2006 | Richenstein et al. | |
| 2006/0284754 A1 | 12/2006 | Garrity et al. | |
| 2006/0285700 A1 | 12/2006 | Felder et al. | |
| 2007/0040588 A1 | 2/2007 | Braswell et al. | |
| 2007/0115161 A1* | 5/2007 | May et al. | 341/155 |
| 2007/0116147 A1* | 5/2007 | May et al. | 375/316 |

FOREIGN PATENT DOCUMENTS

WO  WO 2004/039011 A2  5/2004

OTHER PUBLICATIONS

Park et al., A 1.8-GHz Self-Calibrated Phase-Locked Loop with Precise I/Q Matching, ASICs, AP-ASIC 2000. Proceedings of the Second IEEE Asia Pacific Conference, Aug. 2000.

First Office Action, Chinese Patent Application No. 2005/80017569.8 (PCT/US2005/039279), State Intellectual Property Office, P.R. China, Aug. 21, 2009.

Manlove et al., A Fully Integrated High-Performance FM Stereo Decoder, IEEE Journal of Solid-State Circuits, vol. 27, No. 3, Mar. 1992.

Van Der Zwan et al., "A" 10.7-MHz 1F-to-Baseband Sigma-Delta A/D Conversion System for AM/FM Radio Receivers, IEEE Journal of Solid-State Circuits, vol. 35, No. 12, Dec. 2000.

Park et al., A 5-MHz IF Digital FM Demodulator, IEEE Journal of Solid-State Circuits, vol. 34, No. 1, Jan. 1999.

TEA5767HN Low-Power FM Stereo Radio for Handheld Applications, Philips Semiconductors, Sep. 20, 2004.

International Search Report and Written Opinion, International Application No. PCT/US06/30209, Sep. 28, 2007.

K. Muhammad et al., A Discrete-Time Bluetooth Receiver in a 0.13 Digital CMOS Process; ISSCC 2004/Session 15/Wireless Consumer ICs/15.1, Texas Instruments, Dallas, Texas, 2004 (pp. 268, 269 and 1-pg. paper continuation).

Search Report Under Section 17(5), Great Britain Application No. GB0524089.0, May 23, 2006.

* cited by examiner

INTEGRATED CIRCUIT HAVING RADIO RECEIVER AND METHODS FOR USE THEREWITH

CROSS REFERENCE TO RELATED PATENTS

The present application is related to the following U.S. patent applications that are commonly assigned:

Receiver and methods for use therewith, having Ser. No. 11/237,339, filed on Sep. 28, 2005;

Mixing module and methods for use therewith, having Ser. No. 11/237,344, filed on Sep. 28, 2005;

Controllable phase locked loop and method for producing an output oscillation for use therewith, having Ser. No. 11/126,553, filed on May 11, 2005;

Handheld Audio System, having Ser. No. 11/126,554, filed on May 11, 2005;

Controllable phase locked loop via adjustable delay and method for producing an output oscillation for use therewith, having Ser. No. 11/153,144, filed on Jun. 15, 2005;

Programmable sample rate analog to digital converter and method for use therewith, having Ser. No. 11/152,910, filed on Jun. 15, 2005;

Clock generator, system on a chip integrated circuit and methods for use therewith, having Ser. No. 11/287,550, filed on Nov. 22, 2005;

Digital clock controller, radio receiver and methods for use therewith, having Ser. No. 11/287,549, filed on Nov. 22, 2005;

Radio receiver, system on a chip integrated circuit and methods for use therewith, having Ser. No. 11/287,571, filed on Nov. 22, 2005;

Radio receiver, system on a chip integrated circuit and methods for use therewith, having Ser. No. 11/287,570, filed on Nov. 22, 2005;

Radio receiver, system on a chip integrated circuit and methods for use therewith, having Ser. No. 11/287,572, filed on Nov. 22, 2005;

Radio receiver, system on a chip integrated circuit and methods for use therewith, having Ser. No. 11/287,551, filed on Nov. 22, 2005;

the contents of which are expressly incorporated herein in their entirety by reference thereto.

TECHNICAL FIELD OF THE INVENTION

The present invention relates to radio receivers used in devices such as integrated circuits, and related methods.

DESCRIPTION OF RELATED ART

Radio receivers can be implemented in integrated circuits that can provide an entire receiver front end on a single chip. One concern in the design of these circuits is the amount of noise that is produced. When implemented in a radio receiver, it is desirable for the noise of these circuits to be as low as possible. Digital circuit designs can reduce the amount of analog noise, such as thermal noise that is introduced. However, other sources of noise can be present. The presence of periodic switching events and other signals within the frequency band of the input circuitry can cause undesirable spurs from switching events. Digital clocks and their harmonics also produce tones that can degrade performance in the analog circuitry.

The need exists for a low noise radio receiver that can be implemented efficiently on an integrated circuit with digital components.

DETAILED DESCRIPTION OF THE INVENTION INCLUDING THE PRESENTLY PREFERRED EMBODIMENTS

The embodiments of the present invention yield several advantages over the prior art. The present invention details an implementation for an efficient architecture for receiving a radio signal. One or more interface clock frequencies vary with the carrier frequency of a received signal, and are controlled so that the interface clock fundamental and it's harmonics do not interfere with the processing of the received signal. This advantage as well as others will be apparent to one skilled in the art when presented the disclosure herein.

Figure 1:
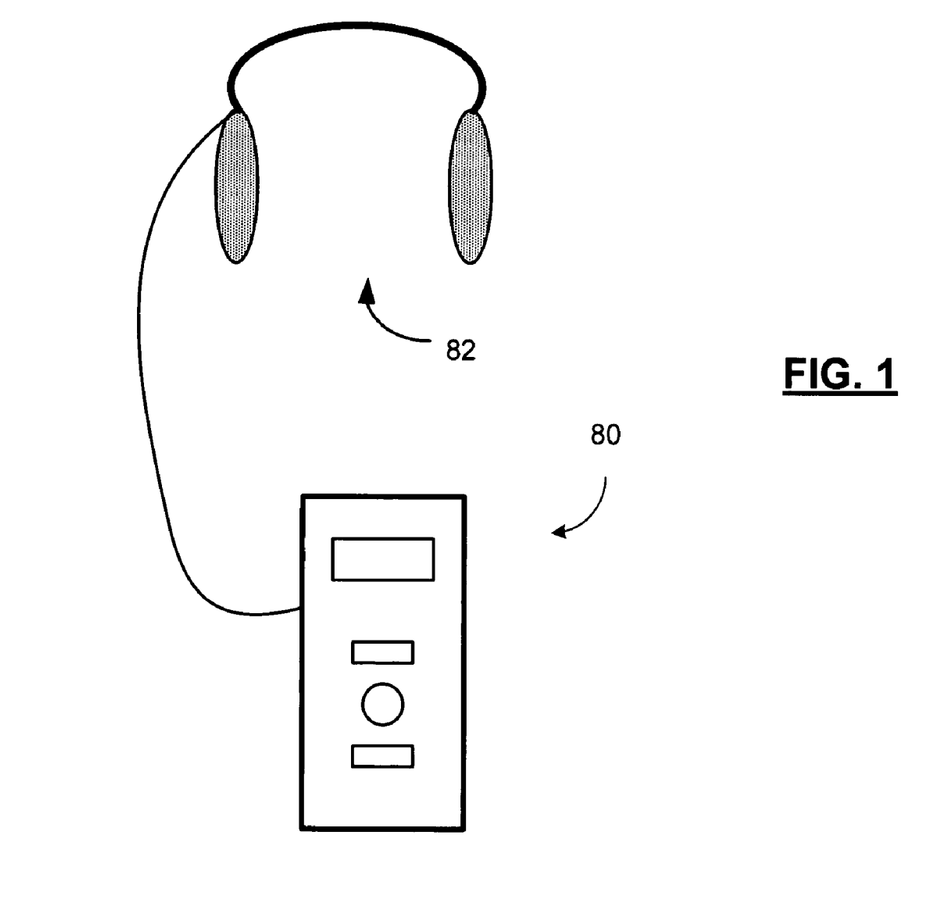
FIG. 1 presents a pictorial diagram of a handheld audio system in accordance with an embodiment of the present invention.

FIG. 1 presents a pictorial diagram of a handheld audio system in accordance with an embodiment of the present invention. In particular, a handheld audio system 80 is shown that receives a radio signal that carries at least one composite audio channel that includes right and left channel stereo audio signals. In an embodiment of the present invention, the radio signal includes one or more of a broadcast frequency modulated (FM) radio signal, a broadcast amplitude modulated (AM) radio signal, an in-band on-channel (IBOC) digital radio signal, a Bluetooth signal, a broadcast satellite radio signal, and a broadcast cable signal.

In operation, the handheld audio system 80 produces an audio output for a user by means of headphones 82 or other speaker systems. In addition to producing an audio output from the received radio signal, the handheld audio system 80 can optionally process stored MP3 files, stored WMA files, and/or other stored digital audio files to produce an audio output for the user. The handheld audio system may also include video features as well. Handheld audio system 80 includes a radio receiver and/or one or more integrated circuits (ICs) that implement the features and functions in accordance with one or more embodiments of the present invention that are discussed herein.

Figure 2:
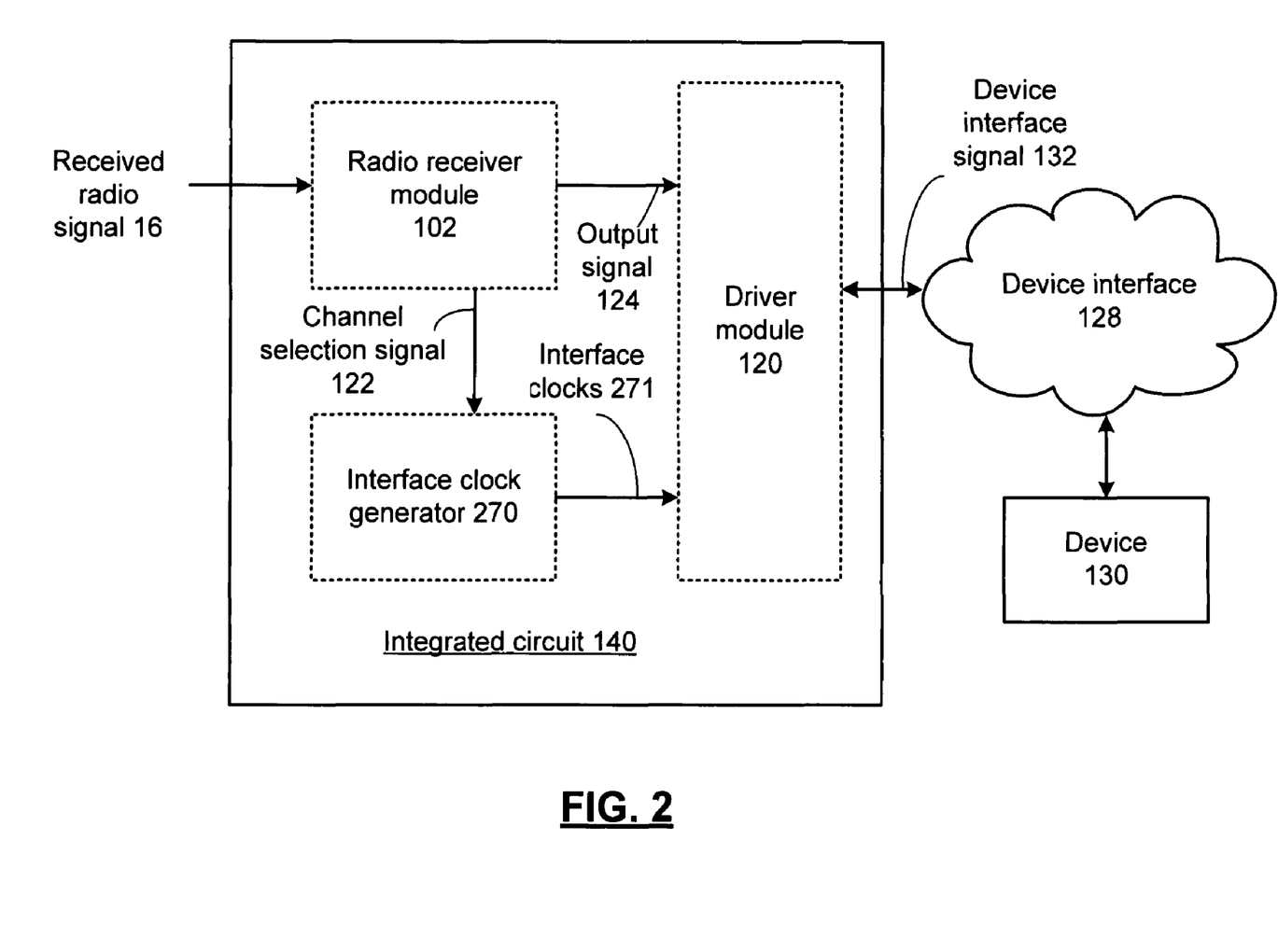
FIG. 2 presents a schematic block diagram of a radio receiver in accordance with an embodiment of the present invention.

FIG. 2 presents a block diagram representation of an integrated circuit in accordance with an embodiment of the present invention. In particular, integrated circuit 140 includes a radio receiver module 102 for receiving a received radio signal 16 having a plurality of channel signals, each of the plurality of channel signals being modulated at one of a corresponding plurality of carrier frequencies, and for converting a selected one of the plurality of channel signals into an output signal 124. An interface clock generator 270 is coupled to a channel selection signal. Interface clock generator 270 generates one or more interface clocks 271 at interface clock frequencies that vary based on the selected one of the plurality of channel signals. A driver module 120 drives a device interface 128, for coupling to a device 130. Driver module 120 operates based on the one or more interface clocks 271.

In an embodiment of the present invention, the received radio signal 16 includes one or more of a broadcast frequency modulated (FM) radio signal, a broadcast amplitude modulated (AM) radio signal, an in-band on-channel (IBOC) digital radio signal, a Bluetooth signal, a broadcast satellite radio signal, and a broadcast cable signal. The output signal 124 can be a demodulated signal, that can be an analog signal, discrete time signal or digital signal that includes the selected channel signal such as an audio channel signal, a control signal, data signal or other signal that is produced by the radio receiver module 102. The device 130 is a device that is external to integrated circuit 14 and may be a separate integrated circuit or device, or other circuit, digital or analog that interfaces with integrated circuit 140 through device interface 128.

In an embodiment of the present invention, driver module 120 produces a device interface signal 132 that is clocked at a first interface clock frequency. Further, the driver module 120 can receive a device interface signal 132 that is sampled at the first interface clock frequency. The device channel interface signal can include the output signal 124, an input signal or control data, either alone, in combination, or formatted with other control and/or signaling information in accordance with an interface protocol that is either proprietary or formatted in accordance with one or more standards. An example of such an interface is provided in greater detail in pending U.S. patent application having Ser. No. 11/126,554, Handheld Audio System, filed on May 11, 2005.

In an embodiment of the present invention, one or more of the interface clock frequencies are less than the carrier frequency of the selected one of the plurality of channel signals. The interface clock frequencies, and integer multiples of the interface clock frequencies, are not substantially equal to the carrier frequency of the selected one of the plurality of channel signals. Choosing the interface clock frequencies in this fashion avoids a situation where either the fundamental or one of the harmonics are substantially equal to the carrier frequency of the selected channel. If one of these clocks had a frequency that was substantially equal to the carrier frequency, it could also lead to portions of the interface clocks 271 being introduced into the input of the radio receiver module 102, interfere with processing of the received radio signal 16 and could show up as increased noise or decreased spurious free dynamic range in one or more portions of integrated circuit 140.

Figure 3:
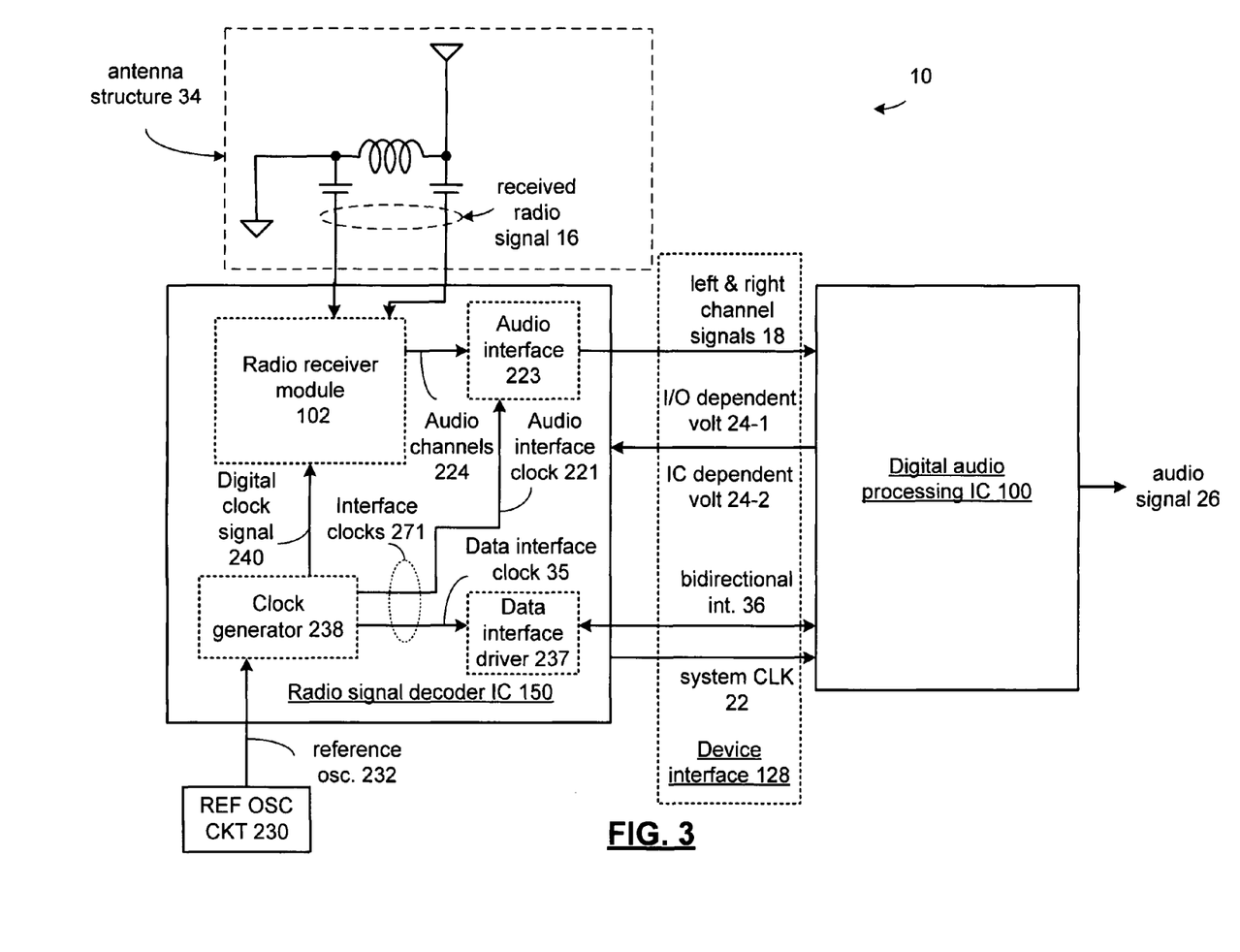
FIG. 3 presents a schematic block diagram of a radio receiver in accordance with an alternative embodiment of the present invention.

FIG. 3 presents a schematic block diagram of a radio receiver in accordance with an embodiment of the present invention. In particular, radio receiver 10 is presented that includes a radio signal decoder integrated circuit 150 that corresponds to a particular embodiment of integrated circuit 140 and that includes a radio receiver module 102, clock generator 238, and/or corresponding features methods in accordance with FIGS. 3-9. In this embodiment, the radio signal decoder integrated circuit 150 is operably coupled to a reference oscillator circuit 230 and an antenna structure 34. The reference oscillation circuit 230 is operably coupled to a crystal and produces therefrom a reference oscillation 232 and a system clock 22 that is provided to digital audio processing IC 100 through device interface 128.

The antenna structure 34 includes an antenna, a plurality of capacitors and an inductor coupled as shown. The received radio signal 16 is provided from the antenna structure 34 to the radio signal decoder integrated circuit 150. The radio receiver module 102 converts the received radio signal 16 into audio channel signals 224 that are used by audio interface 223 to produce left and right channel signals 18 that are provided to digital audio processing IC 100 through device interface 128.

The digital audio processing integrated circuit 100, via a DC-DC converter, generates an input/output (I/O) dependent supply voltage 24-1 and an integrated circuit (IC) dependent voltage 24-2 that are supplied to the radio signal decoder IC 150 through device interface 128. In one embodiment, the I/O dependent voltage 24-1 is dependent on the supply voltage required for input/output interfacing of the radio signal decoder IC and/or the digital audio processing IC 100 (e.g., 3.3 volts) and the IC dependent voltage 24-2 is dependent on the IC process technology used to produce integrated circuits 150 and 100. The digital audio processing integrated circuit 100 further includes a processing module that may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated in the Figures that follow.

The device interface 128 between the integrated circuits 150 and 100 further includes a bi-directional interface 36. Such an interface may be a serial interface for the integrated circuits 150 and 100 to exchange control data and/or other types of data. In one embodiment, the bi-directional interface 36 may be one or more serial communication paths that are in accordance with the I²C serial transmission protocol. As one of ordinary skill in the art will appreciate, other serial transmission protocols may be used for the bi-directional interface 36 and the bi-directional interface 36 may include one or more serial transmission paths.

In an embodiment of the present invention, radio signal decoder IC 150 is a system on a chip integrated circuit that operates as follows. Radio receiver module 102 receives received radio signal 16 having a plurality of channel signals, each of the plurality of channel signals being modulated at one of a corresponding plurality of carrier frequencies. Radio receiver module 102 is operable to convert a selected one of the plurality of channel signals into audio channel signals 224. Clock generator 238 generates a digital clock signal 240 and interface clocks 271 that have corresponding interface clock frequencies that vary based on the selected one of the plurality of channel signals. Interface clocks 271 include audio interface clock 221 that is used by audio interface 223 to produce left and right channel signals 18 that include a stream of data that is clocked at the frequency of audio interface clock 221. In addition, data interface clock 35 is generated for use by data interface driver 237 that manages the input and output of data through bidirectional interface 36. In particular, the data received from bidirectional interface 36 is sampled based on data interface clock 35.

In an embodiment of the present invention, the interface clock frequencies, and the harmonics that are created at integer multiples of the interface clock frequencies, are generated in a fashion so as to not be substantially equal to the carrier frequency of the selected one of the plurality of channel signals.

In addition to the configurations shown in FIG. 3, other configurations that include one or more integrated circuits are likewise possible. The broad scope of the present invention includes other partitioning of the various elements of radio receiver 10 into one or more integrated circuits.

Figure 4:
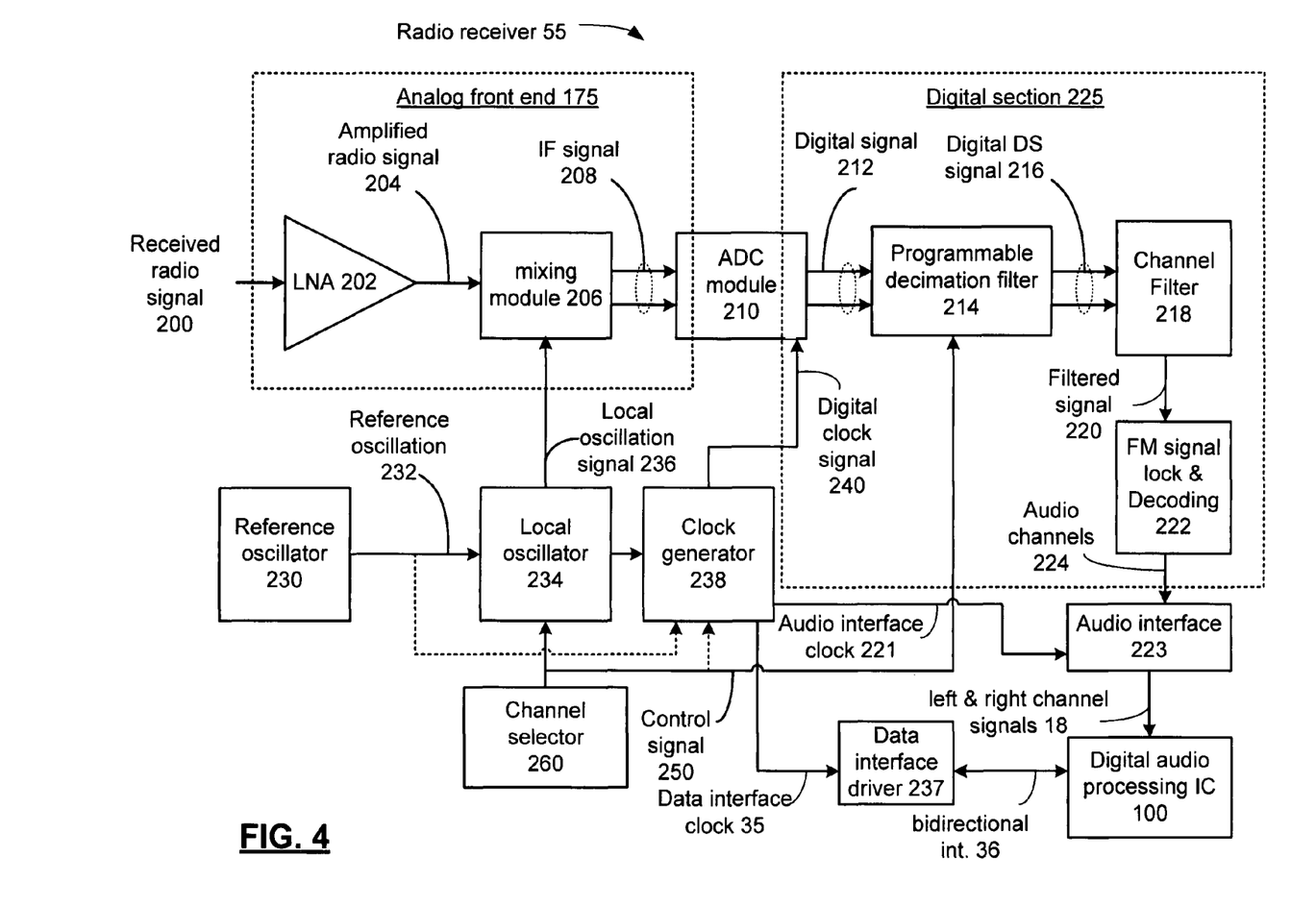
FIG. 4 presents a combination block diagram and schematic diagram of a radio receiver in accordance with an embodiment of the present invention.

FIG. 4 presents a combination block diagram and schematic diagram of a radio receiver in accordance with an embodiment of the present invention. In particular, a radio receiver 55 receives a received radio signal 200 that includes a plurality of broadcast FM channel signals, each of the plurality of channel signals being modulated at one of a corresponding plurality of carrier frequencies. Reference oscillator 230 produces a reference oscillation 232 that is transformed by local oscillator 234 into a local oscillation signal 236 at a local oscillation frequency. A channel selector 260 produces control signal 250 that selects the local oscillation frequency for local oscillator 234 corresponding to a selection of one of the plurality of channels. In an embodiment of the present invention, local oscillator 234 includes a phase locked loop circuit for producing a selected local oscillation frequency based on the selected one of the plurality of channels. Clock generator 238 generates digital clock signal 240 and interface clocks that include audio interface clock 221 and data interface clock 35, that are generated based on local oscillation 236, and optionally based on reference oscillation 232 and control signal 250.

Low noise amplifier 202 produces a amplified radio signal 204 that is sampled and mixed with the local oscillation signal 236 by mixing module 206 to form a discrete time IF signal 208 at an intermediate frequency. In a preferred embodiment of the present invention, the gain at which the low noise amplifier 202 amplifies the receive signal 200 is dependent on the magnitude of the received radio signal 200 and an automatic gain control circuit. Note that IF signal 208 is a modulated signal and if the local oscillation signal 236 has an effective frequency (when considering the sample rate) that matches the frequency of the selected channel, the IF signal 208 will have a carrier frequency of approximately zero. If the local oscillation signal 236 has an effective frequency that is not equal to the carrier frequency of received radio signal 200, then the IF signal 208 will have a carrier frequency based on the difference between the carrier frequency of the selected channel and the effective frequency of local oscillation 236. In such a situation, the carrier frequency of the IF signal 208 may range from 0 hertz to one megahertz or more.

Analog to digital converter (ADC) module 210 converts the IF signal 208 into a digital signal 212, based on clock signal 240. As noted above, digital signal 212 may or may not be down-converted to baseband. Programmable decimation filter 214 converts the digital signal 212 into a digital downsampled (DS) signal 216, in response to control signal 250. Digital clock signal 240 is a variable frequency clock and varies as a function of local oscillation signal 236. As digital clock signal 240 is adjusted to convert analog data to digital data at various rates, programmable decimation filter 214 adjusts to produce digital downsampled signal 216 at a roughly constant output rate so that channel filter 218, a digital filter that provides channel separation and produces filtered signal 220, can employ constant coefficients. FM signal lock and decoding module 222, tracks the FM signal via the 19 kHz pilot signal and produces audio channel signals 224 that are used by audio interface 223 to produce left and right channel signals 18 that are transmitted to digital audio processing IC 100. In a preferred embodiment of the present invention, the IF signal 208, digital signal 212, digital downsampled signal 216 each include an in-phase signal and a quadrature-phase signal forming parallel signal paths through these portions of radio receiver 55.

While the description above includes a programmable decimation filter that adjusts with the digital clock frequency, other implementations are likewise possible, including a fixed decimation filter and variable channel filter, etc., within the broad scope of the present invention.

Figure 5:
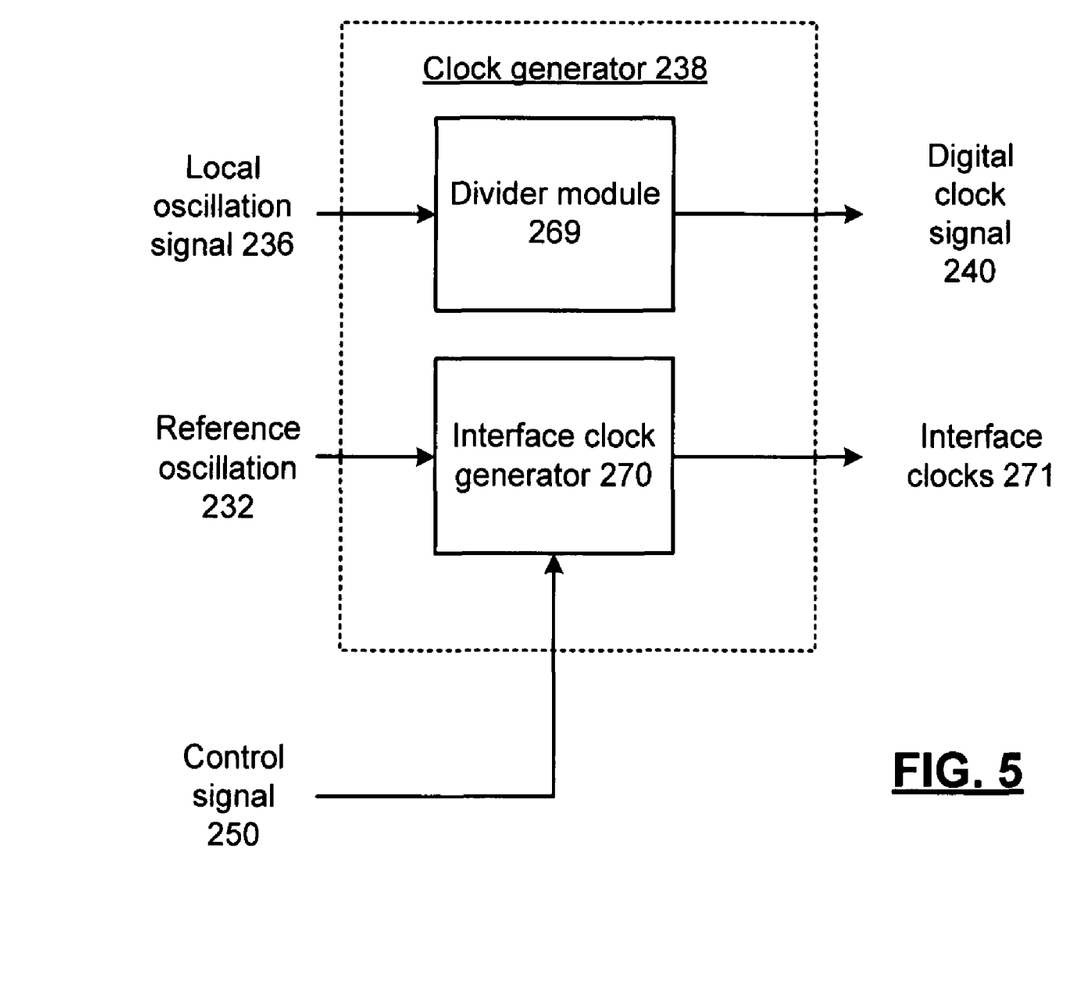
FIG. 5 presents a block diagram representation of a clock generator in accordance with an embodiment of the present invention.

FIG. 5 presents a block diagram representation of a clock generator in accordance with an embodiment of the present invention. In particular, digital clock signal 240 is formed by dividing the local oscillation 236 using divider module 269 that divides the frequency of local oscillation 236 by a divisor. Interface clock generator 270 generates interface clocks 271 based on reference oscillation 232 and control signal 250 as will be discussed further in conjunction with FIG. 6.

Figure 6:
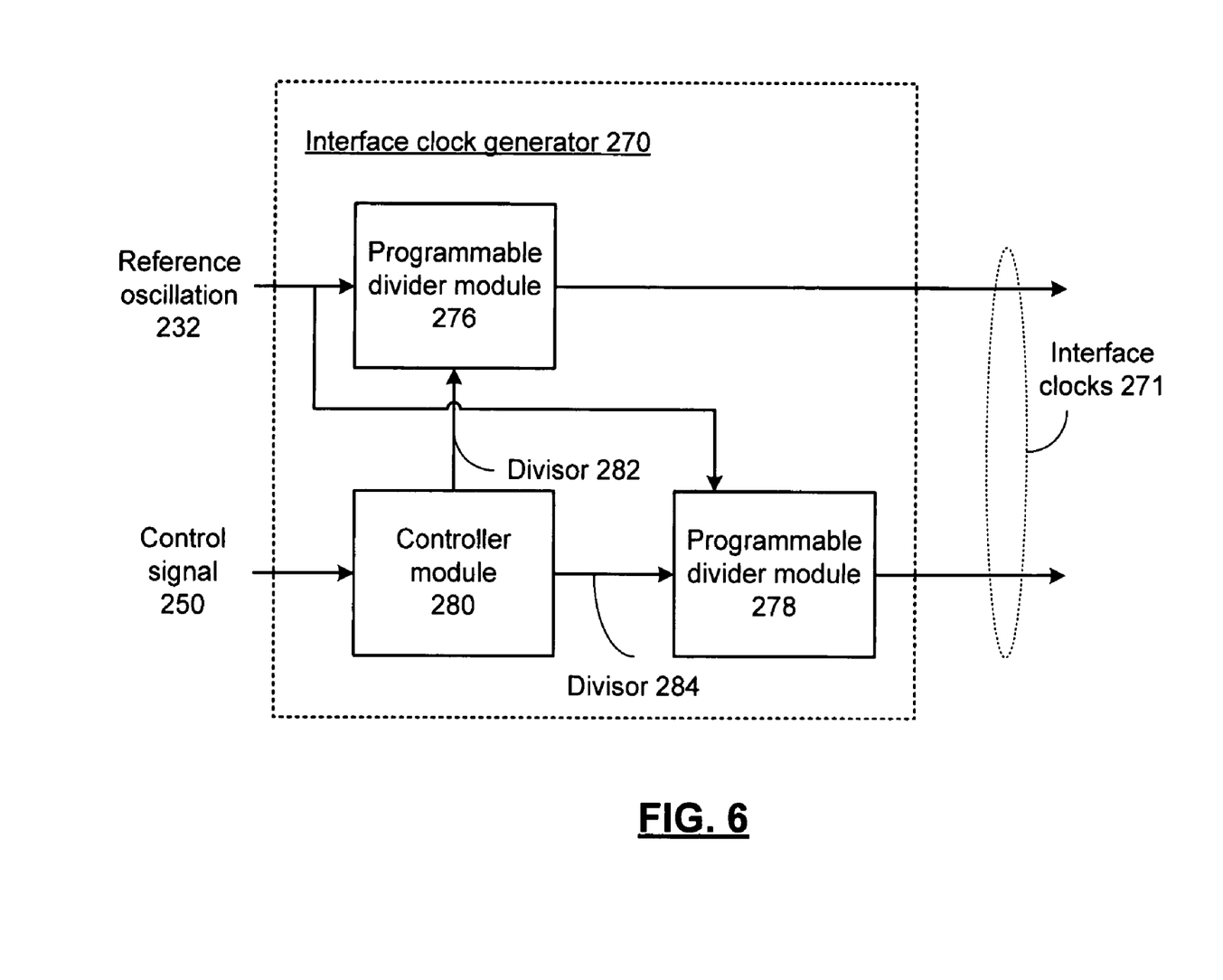
FIG. 6 presents a block diagram representation of an interface clock generator 270 in accordance with an embodiment of the present invention.

FIG. 6 presents a block diagram representation of an interface clock generator 270 in accordance with an embodiment of the present invention. In this embodiment, a controller module 280 produces divisor 282 and 284 that vary based on the carrier frequency of the selected one of the plurality of channel signals. Programmable divider modules 276 and 278, in turn generate interface clock signals 271, such as audio interface clock 221 and data interface clock 35 discussed in conjunction with FIG. 5, by dividing the reference oscillation 232 by these divisors. In particular, control signal 250 is used by controller 280 to select particular divisors 282 and 284 so that the fundamental and harmonics of the interface clocks 271 are not substantially equal to the carrier frequency of the selected channel.

Consider the operation of interface clock generator 270 in light of an example presented in conjunction with the embodiments presented in FIG. 4. In this example, received radio signal 200 is a frequency modulated (FM) broadcast signal that includes a plurality of channels that are spaced 200 kHz apart in the range of 76 MHz to 108 MHz. Consider further a selected channel to be received that operates at a carrier frequency of 90 MHz. Channel selector 260 generates a control signal 250 that includes a 7 bit signal that commands local oscillator 234 to produce a 360 MHz local oscillation signal 236 from reference oscillation 232.

Low noise amplifier 202 amplifies and passes the entire 76 MHz-108 MHz broadcast band as amplified radio signal 200. Mixing module 206 samples the amplified radio signal 204 at 90 MHz, down converts and filters the output to produce an IF signal 208, at or near baseband, having a 200 kHz bandwidth, corresponding to the broadcast FM channel whose carrier frequency was 90 MHz. ADC module 210 converts the IF signal 208 into a digital signal 212 based on a digital clock signal 240 having a frequency of 60 MHz, that is formed by divider module 269 dividing the local oscillator signal by a divisor D=6, producing a frequency that is substantially equal to $\frac{2}{3}$ of the carrier frequency of the received signal. Harmonics of the digital clock signal appear at 120 MHz, 180 MHz, 240 MHz, . . . , all at frequencies that are spaced from the 96 MHz carrier frequency so as to reduce harmful interference.

Reference signal 232 is a 24 MHz clock signal that is divided by a divisor 282 of 4. by programmable divider module 276. This produces a 6 MHz audio interface clock 271 with harmonics that include 90 MHz. Note that the 15$^{th}$ harmonic of the interface clock 271 falls in the same frequency band as the desired signal. In this case, the divisor 282 could be selected to be 5, so that the interface clock 227 is at 4.8 MHz and no harmonic of the interface clock fall near the desired signal at 90 MHz. When however, a different channel is selected, for instance with a carrier frequency of 94 MHZ, different divisors 282 and 284 may be required to avoid harmonics that are substantially equal to 94 MHz.

In an embodiment of the present invention, divisors 282 and 284 are precalculated for each channel carrier frequency (and each possible value of control signal 250). These divisor values are stored in a look-up table associated with controller module 280. In this embodiment, as a new channel is selected, the control signal is used to index the look-up table to determine the values of divisor 282 and 284 so as to avoid harmful interference at the particular carrier frequency of that channel.

The examples above use integer divisors, but fractional dividers can be used to implement programmable divider modules 276 and 278. In some cases, fractional divisors are required because the 24 MHz frequency of reference oscillation 232 is a factor of the 96 MHz carrier frequency of the selected channel. In other embodiments where the frequency of reference oscillation is not a factor of the selected channel frequency, or if possible, none of the possible channel frequencies, integer divisors may be used.

Figure 7:
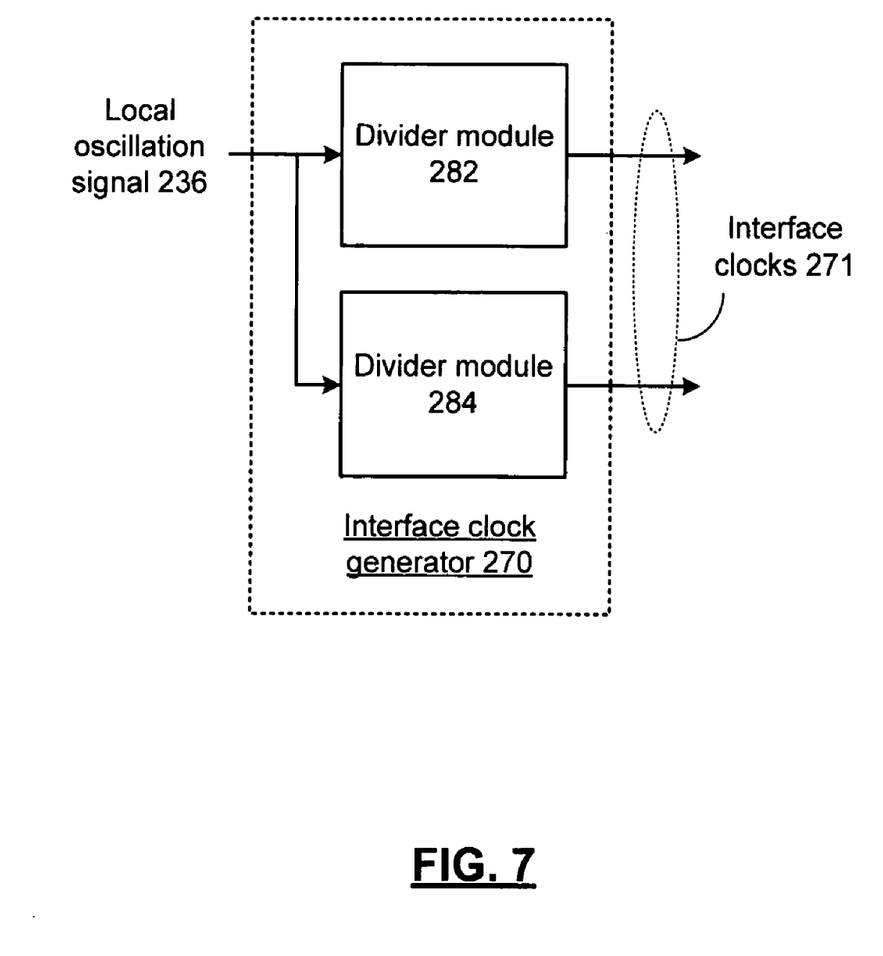
FIG. 7 presents a block diagram representation of an interface clock generator 270 in accordance with an alternative embodiment of the present invention.

FIG. 7 presents a block diagram representation of an interface clock generator 270 in accordance with an alternative embodiment of the present invention. In particular, interface clock generator 270 includes divider modules 282 and 284 that generate interface clocks 271 by a dividing local oscillation signal 236 each by a corresponding fixed divisor. In the example presented in association with FIG. 6 whereby a 90 MHz local oscillation frequency is used that corresponds to a 90 MHz carrier frequency, a 4.8 MHz audio interface clock can be generated using a divisor of 75 (360/75. As different channels are selected with different carrier frequencies, the local oscillation frequency is changed to be equal to or substantially equal to the carrier frequency. The use of constant divisors therefore maintains the relationship that the harmonics avoid potentially harmful interference with the carrier frequency of the selected channel.

In an embodiment of the present invention, divider modules 269, 282 and 284 and programmable divider modules 276 and 278 can be implemented in circuitry using shift registers, flip-flops and/or counters. In an alternative embodiment of the present invention, each of these dividers can be implemented using fractional dividers that allow the divisor to be a mixed number with both an integer and factional component, as will be evident to one of ordinary skill in the art based on the teachings disclosed herein. Also, a phase locked loop circuit could be used to multiply up by N, and divide by M, to achieve a ratio of integers (N/M) to implement a particular divisor.

Figure 8:
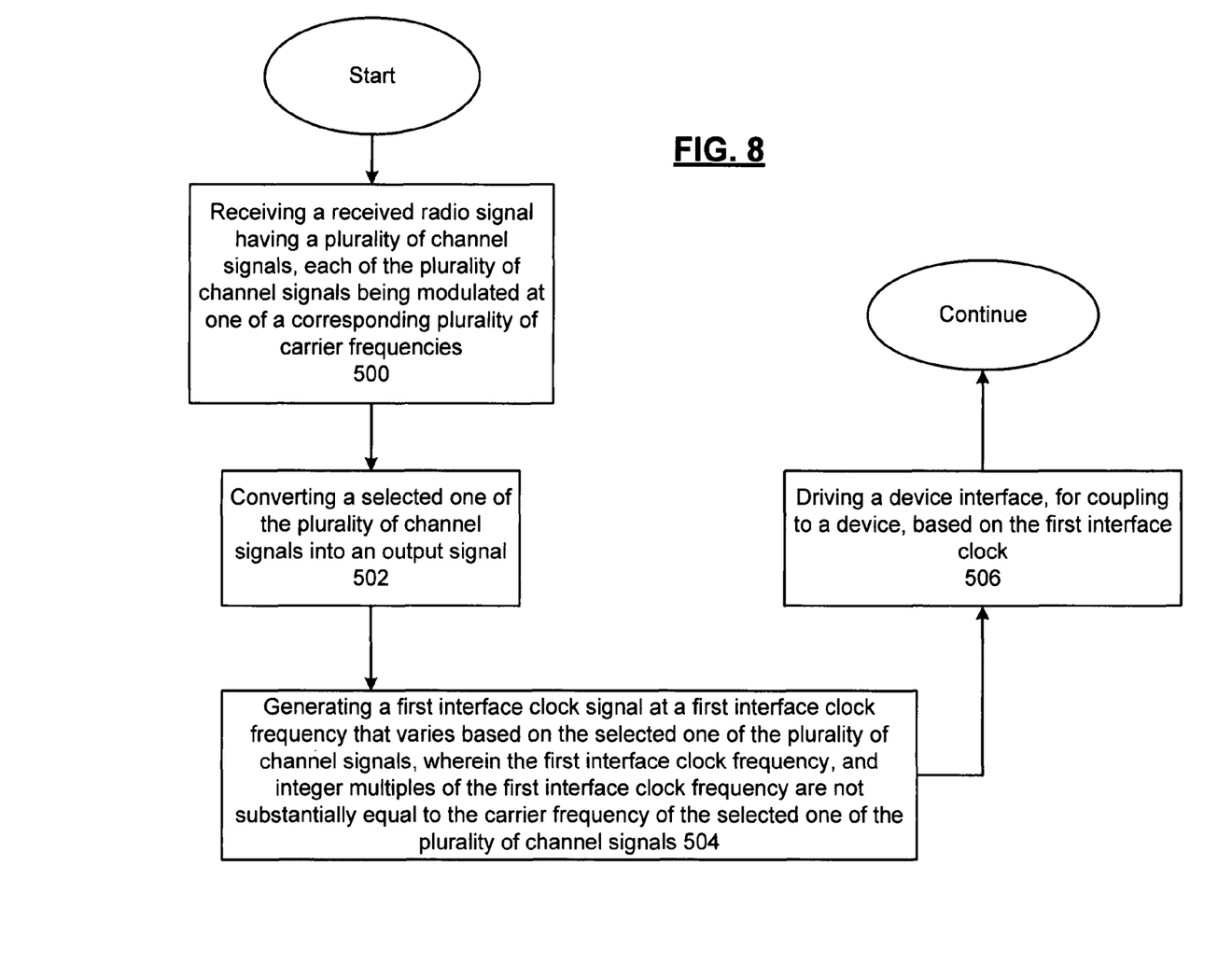
FIG. 8 presents a block diagram of a method in accordance with an embodiment of the present invention.

FIG. 8 presents a block diagram of a method in accordance with an embodiment of the present invention. In particular, a method is presented for use in conjunction with embodiments presented in FIGS. 1-7. The method begins in step 500 by receiving a received radio signal having a plurality of channel signals, each of the plurality of channel signals being modulated at one of a corresponding plurality of carrier frequencies. In step 502, a selected one of the plurality of channel signals is converted into an output signal. In step 504, a first interface clock signal is generated at a first interface clock frequency that varies based on the selected one of the plurality of channel signals wherein the first interface clock frequency, and integer multiples of the first interface clock frequency are not substantially equal to the carrier frequency of the selected one of the plurality of channel signals. In step 506, a device interface, for coupling to a device, is driven based on the first interface clock.

In an embodiment, step 506 includes producing a device interface signal that is clocked at the first interface clock frequency. The device interface signal can include an audio channel signal. Further, step 506 can include sampling a device interface signal at the first interface clock frequency and the device interface signal can include control data.

In an embodiment, the received radio signal is one of: a broadcast frequency modulated radio signal, a broadcast amplitude modulated radio signal, a broadcast satellite radio signal, and a broadcast cable signal. In an embodiment, step 500 includes processing the received radio signal along an in-phase signal path and a quadrature-phase signal path. Further, the device can be an integrated circuit device or other device as discussed in conjunction with FIG. 2.

Figure 9:
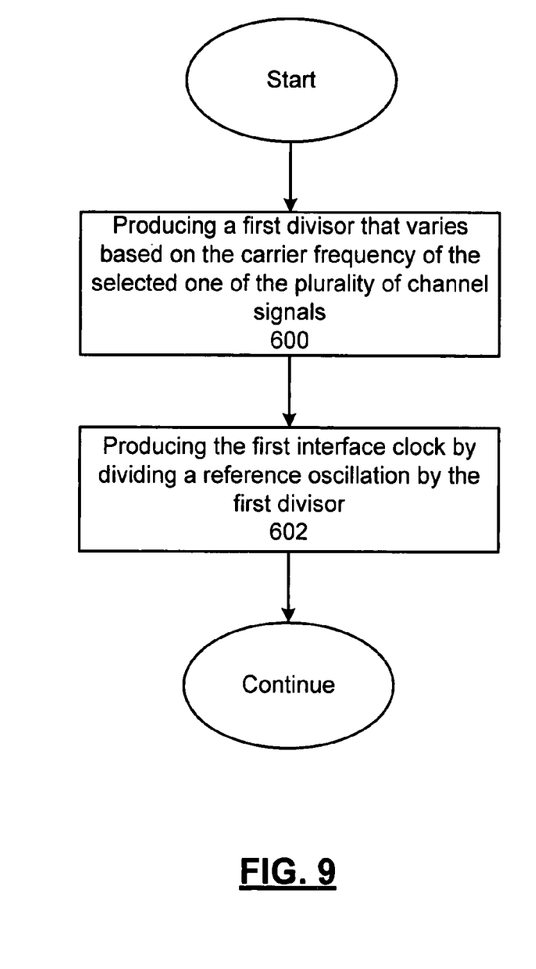
FIG. 9 presents a block diagram of a method in accordance with an embodiment of the present invention.

FIG. 9 presents a block diagram of a method in accordance with an embodiment of the present invention. A method is presented for use in conjunction with embodiments presented in FIGS. 1-8. In particular, a method is presented for use in step 504 of FIG. 8. In step 600, a first divisor is produced that varies based on the carrier frequency of the selected one of the plurality of channel signals. In step 602 the first interface clock is produced by dividing a reference oscillation by the first divisor.

Figure 10:
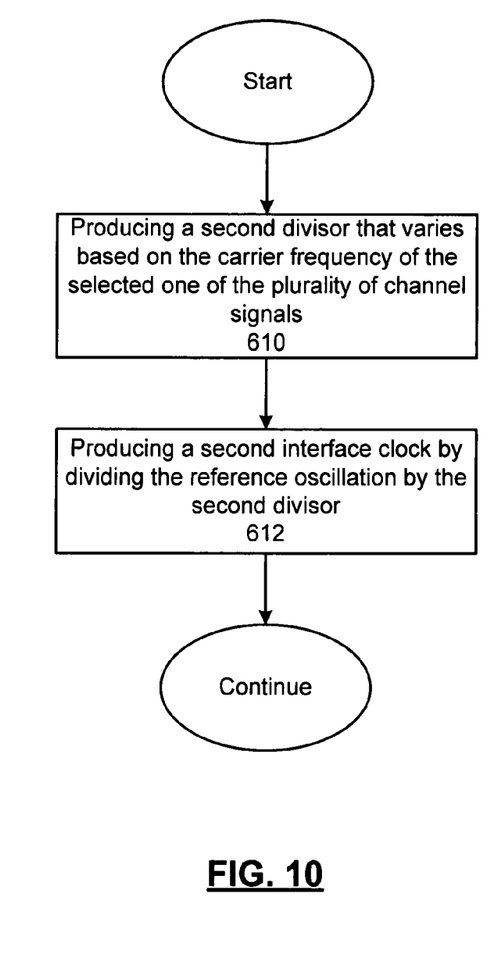
FIG. 10 presents a block diagram of a method in accordance with an embodiment of the present invention.

FIG. 10 presents a block diagram of a method in accordance with an embodiment of the present invention. A method is presented for use in conjunction with embodiments presented in FIGS. 1-9. In particular, a method is presented for use in step 504 of FIG. 8. In step 610, a second divisor is produced that varies based on the carrier frequency of the selected one of the plurality of channel signals. In step 612 the second interface clock is produced by dividing a reference oscillation by the second divisor.

Figure 11:
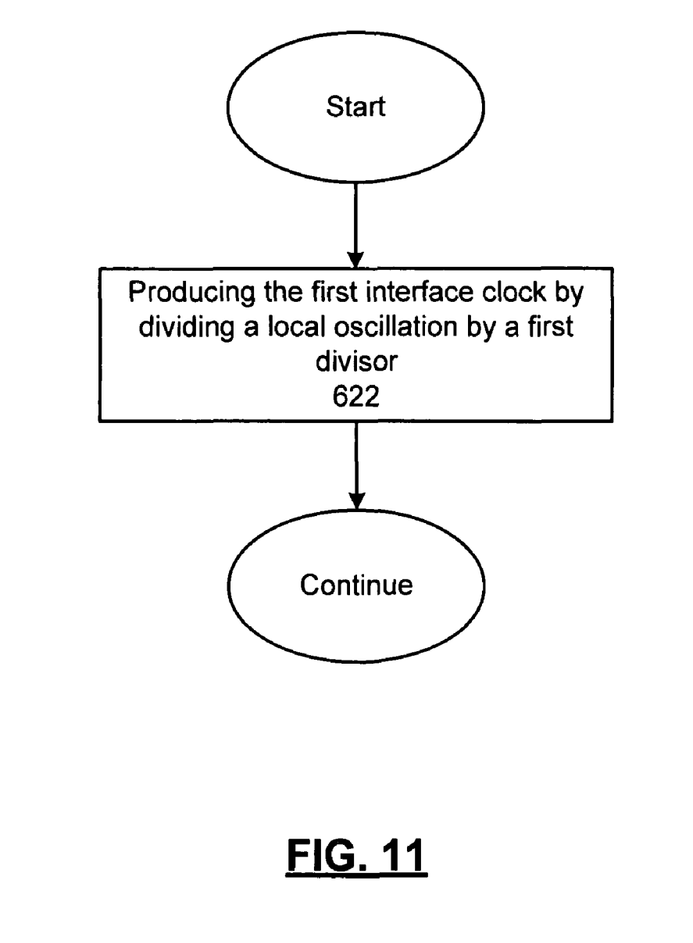
FIG. 11 presents a block diagram of a method in accordance with an embodiment of the present invention.

FIG. 11 presents a block diagram of a method in accordance with an embodiment of the present invention. A method is presented for use in conjunction with embodiments presented in FIGS. 1-10. In particular, a method is presented for use in step 504 of FIG. 8. In step 622, the first interface clock is produced by dividing a local oscillation signal by a first divisor.

Figure 12:
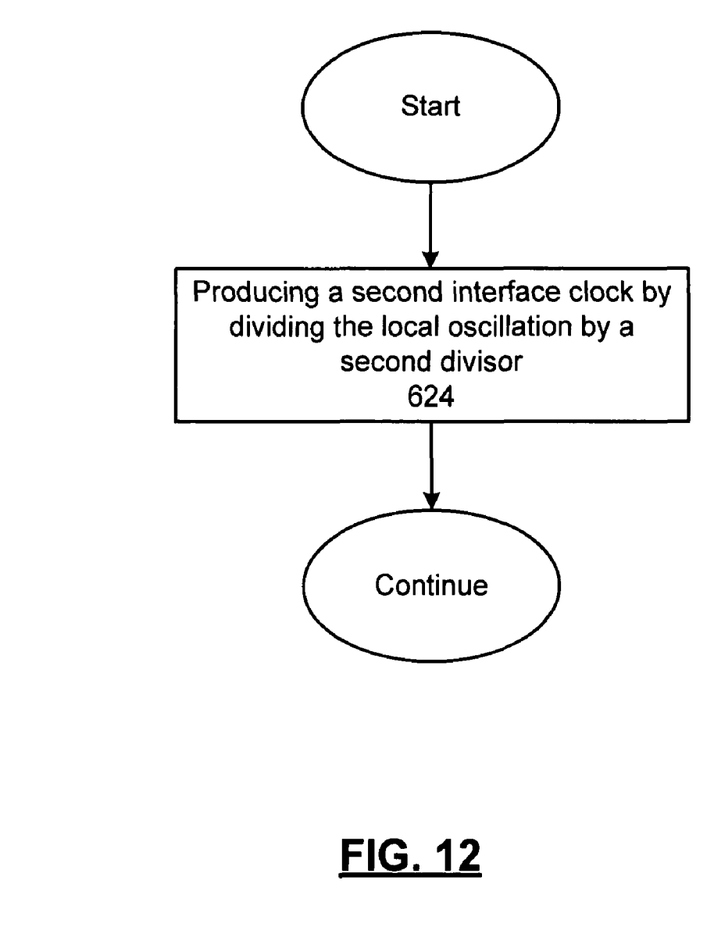
FIG. 12 presents a block diagram of a method in accordance with an embodiment of the present invention.

FIG. 12 presents a block diagram of a method in accordance with an embodiment of the present invention. A method is presented for use in conjunction with embodiments presented in FIGS. 1-11. In particular, a method is presented for use in step 504 of FIG. 8. In step 624, the second interface clock is produced by dividing a local oscillation signal by a second divisor.

The various divisors disclosed in conjunction with FIGS. 8-12 can be either an integer or a mixed number that includes a fraction.

Figure 13:
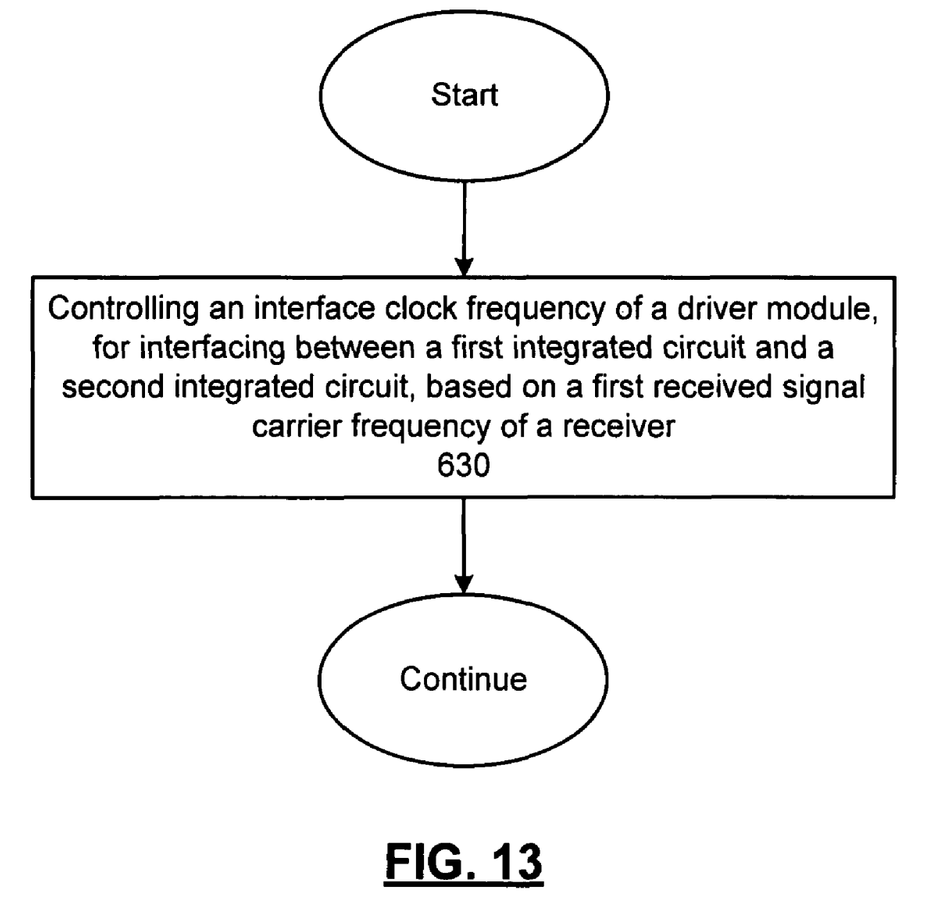
FIG. 13 presents a block diagram of a method in accordance with an embodiment of the present invention.

FIG. 13 presents a block diagram of a method in accordance with an embodiment of the present invention. A method is presented for use in conjunction with embodiments presented in FIGS. 1-11. In step 630 an interface clock frequency of a driver module, for interfacing between a first integrated circuit and a second integrated circuit, is controlled based on a first received signal carrier frequency of a receiver.

In an embodiment of the present invention, the interface clock frequency, and integer multiples of the interface clock frequency, are not substantially equal to the received signal carrier frequency. In addition, the receiver and the driver module are implemented on the first integrated circuit.

In preferred embodiments, the various circuit components are implemented using 0.35 micron or smaller CMOS technology. Provided however that other circuit technologies, both integrated or non-integrated, may be used within the broad scope of the present invention. Likewise, various embodiments described herein and the various modules that they contain can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a radio receiver and integrated circuit. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. An integrated circuit comprising:
a radio receiver module to receive a radio signal having a plurality of channel signals, each of the plurality of channel signals being modulated at one of a corresponding plurality of carrier frequencies, and to convert a selected one of the plurality of channel signals into an output signal;
a channel selector module to produce a control signal;
a programmable decimation filter, responsive to the control signal, to down-sample the output signal to produce a down-sampled digital signal at a frequency that is a non-integer multiple of a carrier frequency of the selected one of the plurality of channel signals;
an interface clock generator, responsive to the control signal, to generate a first interface clock at a first interface clock frequency that varies based on the selected one of the plurality of channel signals wherein the first interface clock frequency, and integer multiples of the first interface clock frequency, are non-integer multiples of the carrier frequency of the selected one of the plurality of channel signals; and
a driver module, operably coupled to the interface clock generator, to drive a device interface to couple a device to the radio receiver module based on the first interface clock; wherein the device interface is a bidirectional interface that is configured to exchange control data between the radio receiver module and the device.

2. The integrated circuit of claim 1 wherein the driver module produces a device interface signal that is clocked at the first interface clock frequency.

3. The integrated circuit of claim 2 wherein the device interface signal includes an audio channel signal.

4. The integrated circuit of claim 1 wherein the driver module receives a device interface signal that is sampled at the first interface clock frequency.

5. The integrated circuit of claim 4 wherein the device interface signal includes control data.

6. The integrated circuit of claim 1 wherein the interface clock generator includes:
a controller module to produce a first divisor that varies based on the carrier frequency of the selected one of the plurality of channel signals; and
a first programmable divider module, operably coupled to the controller module, to produce the first interface clock by dividing a reference oscillation by the first divisor.

7. The integrated circuit of claim 6 wherein the first programmable divider module includes a fractional divider.

8. The integrated circuit of claim 6 wherein the controller module further produces a second divisor that varies based on the carrier frequency of the selected one of the plurality of channel signals and wherein the interface clock generator further includes a second programmable divider module, operably coupled to the controller module, to produce a second interface clock by dividing the reference oscillation by the second divisor.

9. The integrated circuit of claim 1 wherein the interface clock generator includes:
a first divider module to produce the first interface clock by dividing a local oscillation signal by a first divisor.

10. The integrated circuit of claim 9 wherein the first divider module includes a fractional divider.

11. The integrated circuit of claim 9 wherein the interface clock generator includes:
a second divider module to produce a second interface clock by dividing the local oscillation signal by a second divisor.

12. The integrated circuit of claim 1 wherein the device interface is an integrated circuit device.

13. The integrated circuit of claim 1 wherein the first interface clock frequency is less than the carrier frequency of the selected one of the plurality of channel signals.

14. The integrated circuit of claim 1 wherein the received radio signal is one of a broadcast frequency modulated radio signal, a broadcast amplitude modulated radio signal, a broadcast satellite radio signal, and a broadcast cable signal.

15. The integrated circuit of claim 1 wherein the radio receiver module includes an in-phase signal path and a quadrature-phase signal path.

16. A method comprising:
receiving, at a radio receiver module, a received radio signal having a plurality of channel signals, each of the plurality of channel signals being modulated at one of a corresponding plurality of carrier frequencies;
selecting a channel signal from the plurality of channel signals and producing a control signal based on a carrier frequency of the selected channel signal;
converting, using the radio receiver module, the selected one of the plurality of channel signals into an output signal;

down-sampling, in response to the control signal, the output signal to produce a down-sampled digital signal at a frequency that is a non-integer multiple of a carrier frequency of the selected channel signal;

generating a first interface clock at a first interface clock frequency that varies based on the selected one of the plurality of channel signals, wherein the first interface clock frequency, and each integer multiple of the first interface clock frequency, are non-integer multiples of the carrier frequency of the selected one of the plurality of channel signals; and driving a device interface to couple a device to the radio receiver module based on the first interface clock, wherein the device interface is a bidirectional interface that is configured to exchange control data between the radio receiver module and the device.

17. The method of claim 16 wherein driving the device interface includes producing a device interface signal that is clocked at the first interface clock frequency.

18. The method of claim 17 wherein the device interface signal includes an audio channel signal.

19. The method of claim 16 wherein driving the device interface includes sampling a device interface signal at the first interface clock frequency.

20. The method of claim 19 wherein the device interface signal includes control data.

21. The method of claim 16 wherein generating the first interface clock includes:

producing a first divisor that varies based on the carrier frequency of the selected one of the plurality of channel signals; and producing the first interface clock by dividing a reference oscillation by the first divisor.

22. The method of claim 21 wherein the first divisor includes a fraction.

23. The method of claim 21 wherein generating the first interface clock further includes:

producing a second divisor that varies based on the carrier frequency of the selected one of the plurality of channel signals; and producing a second interface clock by dividing the reference oscillation by the second divisor.

24. The method of claim 16 wherein generating the first interface clock includes:

producing the first interface clock by dividing a local oscillation signal by a first divisor.

25. The method of claim 24 wherein the first divisor includes a fraction.

26. The method of claim 24 wherein generating the first interface clock further includes:

producing a second interface clock by dividing the local oscillation signal by a second divisor.

27. The method of claim 16 wherein the device interface is an integrated circuit device.

28. The method of claim 16 wherein the first interface clock frequency is less than the carrier frequency of the selected one of the plurality of channel signals.

* * * * *